(12) United States Patent
Park

(10) Patent No.: US 9,054,283 B2
(45) Date of Patent: Jun. 9, 2015

(54) LIGHT EMITTING DIODE PACKAGE AND METHOD OF MANUFACTURING THE SAME

(75) Inventor: Bo Geun Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 1247 days.

(21) Appl. No.: 12/879,999

(22) Filed: Sep. 10, 2010

(65) Prior Publication Data

US 2010/0327308 A1 Dec. 30, 2010

Related U.S. Application Data

(62) Division of application No. 11/585,855, filed on Oct. 25, 2006.

(30) Foreign Application Priority Data

Oct. 27, 2005 (KR) .................. 10-2005-0101772

(51) Int. Cl.
*H01L 33/00* (2010.01)
*H01L 33/54* (2010.01)
*B29C 39/02* (2006.01)
(Continued)

(52) U.S. Cl.
CPC .............. *H01L 33/54* (2013.01); *B29C 39/025* (2013.01); *B29C 39/026* (2013.01); *B29C 39/10* (2013.01); *B29L 2011/00* (2013.01); *H01L 2224/48091* (2013.01)

(58) Field of Classification Search
CPC ....... H01L 33/56; H01L 33/50; H01L 33/502; H01L 33/52; H01L 24/49; H01L 2924/0665; H01L 51/5237; H01L 31/0203; H01L 27/14618

USPC .............. 257/98, 99, 100, 667, 668, E21.002, 257/E33.059, E33.061, E33.073; 438/27; 362/84, 296, 300; 313/512, 498, 499, 313/503, 506, 311
See application file for complete search history.

(56) References Cited

U.S. PATENT DOCUMENTS

| 4,888,226 A | 12/1989 | Wong |
| 5,013,337 A | 5/1991 | Bedard et al. |
| 5,213,864 A | 5/1993 | Wong |

(Continued)

FOREIGN PATENT DOCUMENTS

| JP | 61-144890 A | 7/1986 |
| JP | 4-28269 A | 1/1992 |

(Continued)

OTHER PUBLICATIONS

A translation of JP-61-144890-A, dated Jul. 2, 1986.

(Continued)

*Primary Examiner* — Meiya Li
(74) *Attorney, Agent, or Firm* — Birch, Stewart, Kolasch & Birch, LLP

(57) ABSTRACT

According to an embodiment, a light emitting apparatus includes a substrate; at least two distinct electrodes on the substrate, wherein the at least two distinct electrodes are spaced from each other; a light emitting device on one of the at least two distinct electrodes; lenses including a first lens and a second lens on the substrate, wherein the second lens is disposed on the first lens, wherein an outermost portion of the second lens is spaced from the substrate; and a supporting unit configured to directly contact the second lens, wherein the supporting unit is formed of a non-conductivity material.

26 Claims, 3 Drawing Sheets

(51) Int. Cl.
*B29C 39/10* (2006.01)
*B29L 11/00* (2006.01)

(56) References Cited

U.S. PATENT DOCUMENTS

| | | | |
|---|---|---|---|
| 6,489,637 | B1 | 12/2002 | Sakamoto et al. |
| 6,633,030 | B2 * | 10/2003 | Joshi .......................... 250/214.1 |
| 6,682,331 | B1 | 1/2004 | Peh et al. |
| 7,138,667 | B2 | 11/2006 | Barnett et al. |
| 7,199,708 | B2 | 4/2007 | Terauchi et al. |
| 7,569,989 | B2 | 8/2009 | Nitta et al. |
| 2003/0122482 | A1 | 7/2003 | Yamanaka et al. |
| 2004/0169466 | A1 | 9/2004 | Suchiro et al. |
| 2004/0198924 | A1 | 10/2004 | Young et al. |
| 2004/0207999 | A1 | 10/2004 | Suehiro et al. |
| 2005/0136570 | A1 | 6/2005 | Suehiro et al. |
| 2005/0139854 | A1 * | 6/2005 | Seki .............................. 257/100 |
| 2005/0239227 | A1 | 10/2005 | Aanegola et al. |
| 2006/0033112 | A1 | 2/2006 | Isoda |
| 2006/0043407 | A1 | 3/2006 | Okazaki |
| 2006/0124953 | A1 | 6/2006 | Negley et al. |
| 2007/0012940 | A1 * | 1/2007 | Suh et al. ........................ 257/99 |
| 2007/0029569 | A1 | 2/2007 | Andrews |
| 2007/0187708 | A1 | 8/2007 | Setomoto et al. |
| 2011/0044044 | A1 | 2/2011 | Jeganathan et al. |

FOREIGN PATENT DOCUMENTS

| | | |
|---|---|---|
| JP | 6-232457 A | 8/1994 |
| JP | 10-144963 A | 5/1998 |
| JP | 2001-111115 A | 4/2001 |
| JP | 2002-170998 A | 6/2002 |
| JP | 2002-314142 A | 10/2002 |
| JP | 2003-179267 A | 6/2003 |
| JP | 2003-188421 A | 7/2003 |
| JP | 2003-234510 A | 8/2003 |
| JP | 2003-309292 A | 10/2003 |
| JP | 2004-87812 A | 3/2004 |
| JP | 2004-207660 A | 7/2004 |
| JP | 2004-235337 A | 8/2004 |
| JP | 2005-50827 A | 2/2005 |
| JP | 2005-167092 A | 6/2005 |
| JP | 2005-203519 A | 7/2005 |
| JP | 2005-229048 A | 8/2005 |
| JP | 2005-235778 A | 9/2005 |
| JP | 2005-340543 A | 12/2005 |
| JP | 2005-536870 A | 12/2005 |
| JP | 2006-519896 A | 8/2006 |

OTHER PUBLICATIONS

An abstract and a machine translation for JP-10-144963-A, dated May 29, 1998.
An abstract and a machine translation for JP-2005-340543-A, dated Dec. 8, 2005.
An abstract and a translation for JP-4-28269-A, dated Jan. 30, 1992.

* cited by examiner (a)

(b)

LIGHT EMITTING DIODE PACKAGE AND METHOD OF MANUFACTURING THE SAME

This application is a Divisional of co-pending U.S. application Ser. No. 11/585,855 filed Oct. 25, 2006, and for which priority is claimed under 35 U.S.C. §120; and this application claims priority of Application No. 10-2005-0101772 filed in the Republic of Korea on Oct. 27, 2005 under U.S.C. §119. The entire contents of all are hereby incorporated by reference.

BACKGROUND OF THE INVENTION

1. Field of the Invention

The present invention relates to a light emitting diode package and a method of manufacturing the same.

2. Description of the Related Art

A light emitting diode (LED) is a semiconductor device that can realize a light source of various colors using a compound semiconductor material such as GaAs, AlGaAs, GaN, InGaN, and AlGaInP.

Generally, color, brightness, luminosity, etc. determine a characteristic of an LED. The characteristic of the LED is generally determined by a compound semiconductor material used in the LED, but is greatly influenced by a package structure for mounting chips.

In particular, as information telecommunication devices have become small-sized and slim, elements such as a resistor, a condenser, and a noise filter have become small-sized even more and been directly mounted in a printed circuit board (PCB) (a surface mount device (SMD) type).

FIG. 1 is a view illustrating an LED package structure according to a related art.

Referring to FIG. 1, an LED package according to a related art includes a PCB 200 having a reflective hole 202 in which an LED 210 is mounted, a reflective coating layer 201 coated with Ag in the reflective hole 202, a cathode electrode 220 and an anode electrode 230 connected with the reflective coating layer 201, and wires 218 connecting the LED 210 with the reflective coating layer 201.

A central region of the reflective coating layer 201 is electrically cut and the reflective coating layer 201 is electrically connected with the cathode electrode 220 and the anode electrode 230. That is, a P electrode and an N electrode of the LED 210 are electrically connected with the reflective coating layer 201 such that the P and N electrodes are connected with the cathode electrode 220 and the anode electrode 230.

The cathode electrode 220 and the anode electrode 230 may be formed by solder bonding. The cathode electrode 220 and the anode electrode 230 are formed, and then a mold lens 250 is formed on the reflective coating layer 201 of the PCB 200 in order to prevent an oxidation of the wires 218, reduce a light loss due to an air resistance, improve thermal conductivity.

Meanwhile, light emitted from the LED 210 is reflected a lot inside the mold lens 250, that is, internal reflection occurs a lot inside the mold lens 250, decreasing the transmittance and eventually decreasing the light efficiency.

SUMMARY OF THE INVENTION

Accordingly, the present invention is related to a light emitting diode and a method of manufacturing the same that substantially obviates one or more problems due to limitations and disadvantages of the related art.

The invention provides an LED package with an excellent light efficiency.

The invention provides an LED package with a simplified manufacturing method thereof.

The invention provides an LED package with an excellent physical stability.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

An embodiment of the invention provides an LED package, comprising: a PCB; an electrode pad formed on the PCB; an LED formed on the PCB; a first molding formed on the LED; and a second molding formed on the first molding.

An embodiment of the invention provides an LED package comprising: a PCB; an electrode pad formed on the PCB; an LED formed on the electrode pad; a first molding formed on the LED; and a second molding formed on the electrode pad and the first molding.

An embodiment of the invention provides a method of manufacturing an LED package, the method comprising: forming an electrode pad on a PCB; forming an LED on the PCB; forming a first molding on the LED by a dispensing method; and forming a second molding on the first molding by a dispensing method.

An embodiment of the invention provides a light emitting apparatus comprising: a substrate; at least two distinct electrodes on the substrate, wherein the at least two distinct electrodes are spaced from each other; a light emitting device on one of the at least two distinct electrodes; lenses including a first lens and a second lens on the substrate, wherein the second lens is disposed on the first lens, wherein an outermost portion of the second lens is spaced from the substrate; and a supporting unit configured to directly contact the second lens, wherein the supporting unit is formed of a non-conductivity material, and wherein the supporting unit is disposed below an upper surface of at least one of the first and second lenses.

An embodiment of the invention provides a light emitting apparatus comprising: a substrate; at least two distinct electrodes on the substrate, wherein the at least two distinct electrodes are spaced from each other; a light emitting device on the substrate; lenses including a first lens and a second lens on the substrate, wherein the second lens is disposed on the first lens, wherein an outermost portion of the second lens is spaced from the substrate; and a supporting unit configured to directly contact and support the second lens, wherein the supporting unit is formed of a non-conductivity material, and wherein a cross-sectional view of the light emitting apparatus includes the supporting unit, the first lens and the light emitting device on a same horizontal plane.

An embodiment of the invention provides a light emitting apparatus comprising: a substrate; at least two distinct electrodes on the substrate, wherein the at least two distinct electrodes are spaced from each other; a light emitting device on the substrate; a first lens disposed on the light emitting device, wherein the first lens includes an upper surface having a convex shape; a second lens disposed on the light emitting device and the first lens, wherein the second lens includes an upper surface and a lower surface; and a supporting unit configured to support the second lens, wherein the lower surface of the second lens includes a concave shape, wherein the lower surface of the second lens is faced with the upper surface of the first lens, wherein at least one portion of the second lens has an irregular thickness.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

It will be understood that when an element is referred to as being 'on' a layer, it can be directly on the layer, and one or more intervening layers may also be present.

Reference will now be made in detail to the preferred embodiments of the present invention, examples of which are illustrated in the accompanying drawings.

Figure 1:
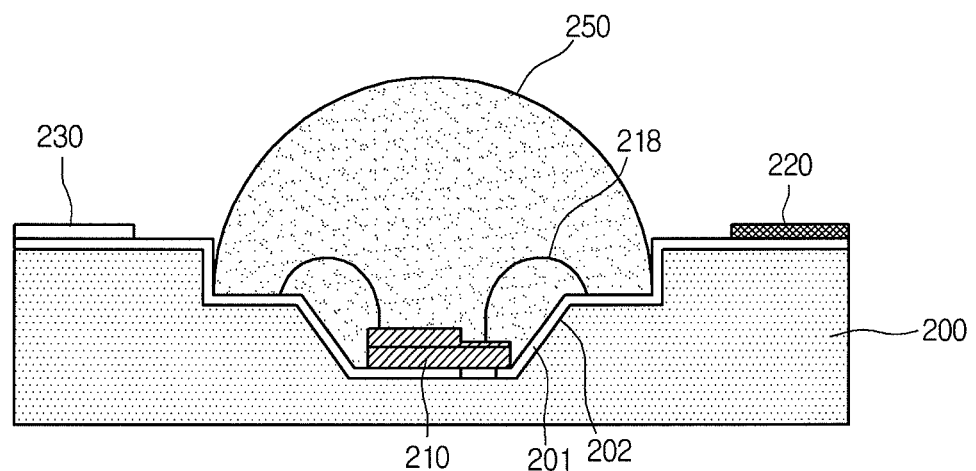
FIG. 1 is a view illustrating an LED package structure according to a related art.
Figure 2:
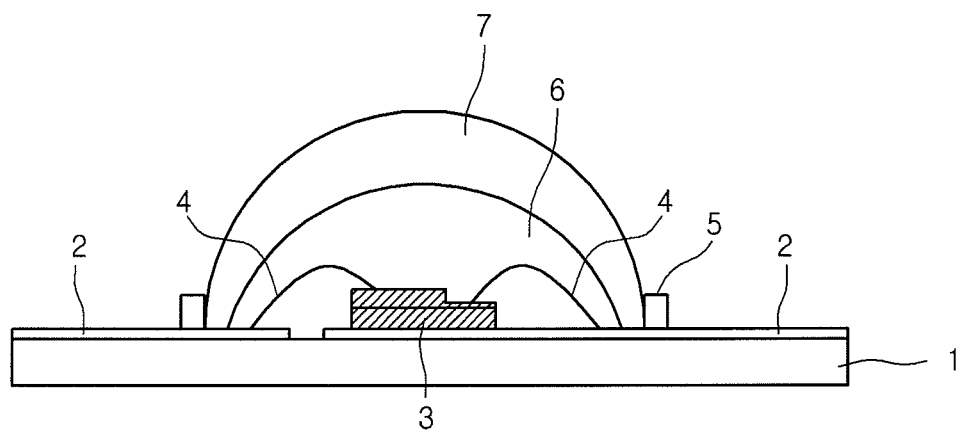
FIG. 2 is a sectional view of an LED package according to an embodiment of the present invention.

FIG. 2 is a sectional view of an LED package according to an embodiment of the present invention.

Referring to FIG. 2, the present invention exemplarily illustrates a SMD type LED package manufactured using a metal core printed circuit board (MCPCB) as an LED package.

An LED package according to an embodiment of the present invention includes an MCPCB 1, two electrode pads 2 formed on the MCPCB 1, an LED 3 formed on the electrode pads 2, two wires 4 connecting the LED 3 with the electrode pads 2, and a first molding 6 formed outside the LED 3 and the wires 4 and a second molding 7 formed outside the first molding 6.

The LED package may further include a guide unit 5 guiding the first and second moldings 6 and 7 to be easily formed.

The electrode pads 2 may be formed of a conductive metal material such as Ag, Au, and Cu on the MCPCB 1 and are connected with the LED 3 through the wires 4. The two electrode pads 2 are not electrically connected, power is supplied to the LED 3 through the two wires 4.

Also, the electrode pads 2 reflect light emitted from the LED 3 to increase the light efficiency.

Also, the LED 3 may be formed on the MCPCB 1 or may be formed on the electrode pads 2, as illustrated in FIG. 2.

In the present invention, the LED 3 is mounted on a planar PCB. That is, the LED 3 is formed on a planar portion of the PCB, and the portion in which the LED 3 is formed and the electrode pads 2 connected with the wires 4 are on the same plane. The MCPCB 1 may be used as the PCB.

In the present invention, the second molding 7 is formed in a hemispheric shape. That is, an outer circumference of a contact surface between the second molding 7 and the MCPCB 1 is formed in a circular shape.

In particular, a maximum distance of the contact surface between the second molding 7 and the MCPCB 1, that is, a diameter of a circle formed of the outer circumference of the contact surface is 1.6-2.4 times larger than a maximum distance between the MCPCB 1 and the second molding 7, that is, a height of the second molding 7. In such a condition, the light efficiency may be maximized.

In other words, a contact surface between the first and second moldings 6 and 7 and the MCPCB 1 is formed in a circular shape, and a diameter of the circular contact surface is formed 1.6-2.4 times larger than the height of the second molding 7.

Figure 4:
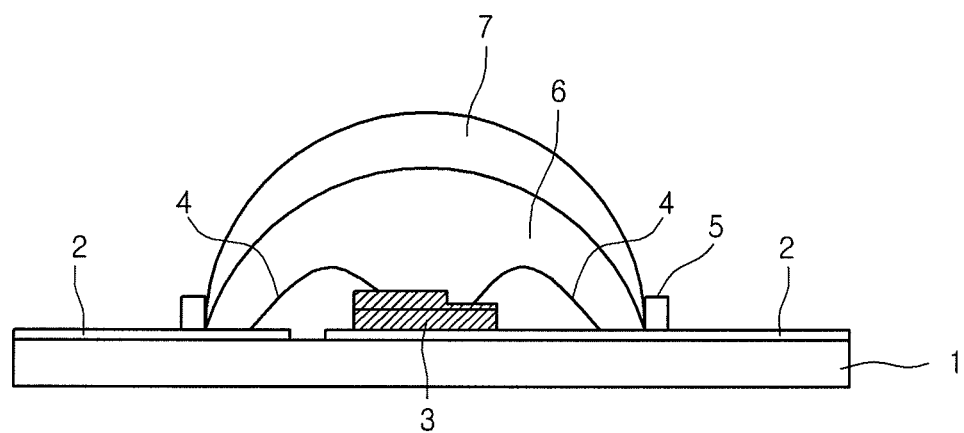
FIG. 4 is a view illustrating a first molding and a second molding of another shape in an LED package according to an embodiment of the present invention and FIG. 5 is a view illustrating a shape of a guide unit according to an embodiment of the present invention.

FIG. 4 is a view illustrating a first molding and a second molding of another shape in an LED package according to an embodiment of the present invention.

Referring to FIG. 4, the first molding 6 may be formed to contact the MCPCB 1 and the second molding 7 may be formed to contact only a surface of the first molding 6 without contacting the MCPCB 1.

In this case, a maximum distance of a contact surface between the first molding 6 and the MCPCB 1, that is, a diameter of a circle formed of an outer circumference of the contact surface is formed 1.6-2.4 times larger than a maximum distance between the MCPCB 1 and the second molding 7, that is, a height of the second molding 7.

In other words, the contact surface between the first molding 6 and the MCPCB 1 is formed in a circular shape, and a diameter of the circular contact surface is formed 1.6-2.4 times larger than the height of the second molding 7.

Meanwhile, a jig may be used to form the second molding 7 in a hemispheric shape having a height and a diameter in the ratio of 1:1.6-2.4, but a manufacturing method using a jig is complicated.

Therefore, in the present invention, the first and second moldings 6 and 7 are formed by dispensing silicon of different kinds, respectively.

Silicon having a high strength and an excellent interfacial adhesion may be used for the first molding 6 in order to protect the LED 3 and the wires 4, and silicon having an excellent adhesion with respect to the first molding 6 may be used as the second molding 7 in order to protect the first molding 6 against external impact.

The first molding 6 may be formed by dispensing a resin including siloxane and phenyl, and the second molding 7 may be formed by dispensing a resin including siloxane, platinum, and silica to the outside of the first molding 6.

The guide unit 5 may be selectively formed to prevent the resin from flowing down during the forming of the second molding 7 using a dispensing method.

Figure 5:
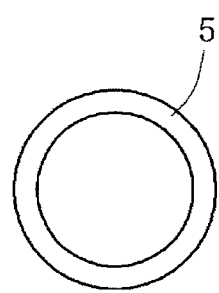
Figure 5:
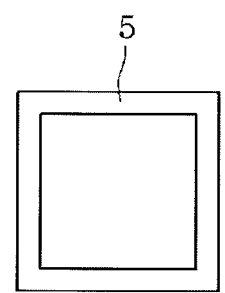

The guide unit 5 may be formed of a nonconductive material in a predetermined shape, for example, as shown in FIG. 5, a shape of a circular ring (see (a) of FIG. 5) or a rectangular ring (see (b) of FIG. 5) with a predetermined height on the electrode pads 2. Also, for example, at least one portion of the second molding 7 has an irregular thickness.

As described above, the LED package according to the present invention includes the LED 3 formed on the planar MCPCB 1 and the first and second moldings 6 and 7 formed in a hemispheric shape outside the LED 3 using a dispensing method.

In the present invention, when a material with a high refraction index (RI) is used in the first molding, compared to the second molding, for example, when a material with an RI of 1.51 is used in the first molding and a material with an RI of 1.46 is used in the second molding, the transmittance is improved and thus the light efficiency is improved. This is because the first molding serves as a buffer, improving the transmittance since an RI of air is 1. On the other hands, in a molding structure of the related art, although a material with an RI of 1.51 or 1.46 is used, internal reflection occurs a lot inside the molding, compared to the present invention, and thus the light efficiency decreases by approximately 10%.

Therefore, the light efficiency of the LED package may be maximized and a manufacturing method thereof is simple.

In particular, the present invention uses materials with an excellent adhesion with respect to each other for the first and second moldings 6 and 7 and thus may prevent a decrease in an adhesion between the first and second moldings 6 and 7 caused by heat generated from the LED 3.

Therefore, a physical stability of the LED is excellent.

Hereinafter, a method of forming an LED package according to the present invention will be described.

Figure 3:
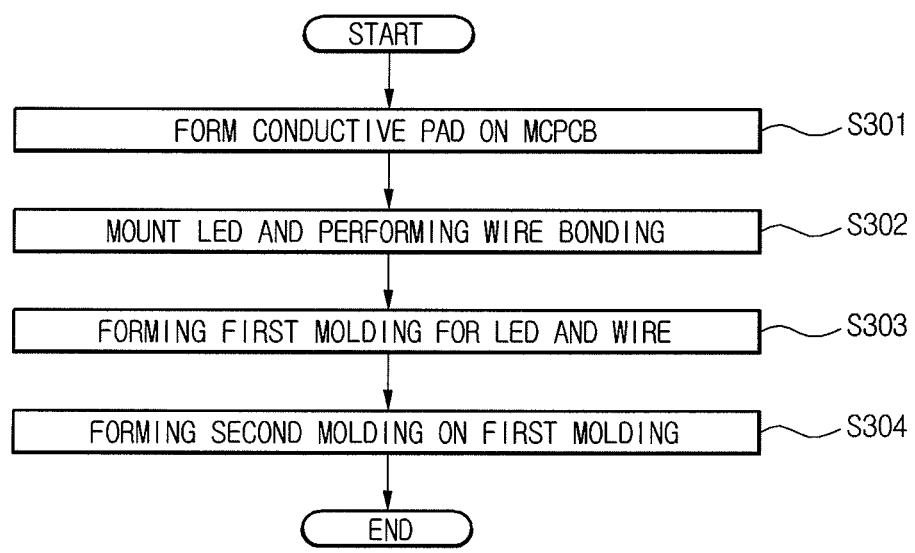
FIG. 3 is a flowchart illustrating a method of forming an LED package according to an embodiment of the present invention.

FIG. 3 is a flowchart illustrating a method of forming an LED package according to an embodiment of the present invention.

Conductive electrode pads 2 of a predetermined thickness are formed on an MCPCB 1 (S301). The electrode pads 2 are formed by plating a conductive metal material such as Ag, Au, and Cu to a predetermined thickness on the MCPCB 1 using electroplating and etching the metal material such that the electrode pads are spaced from each other by a predetermined distance as illustrated in FIG. 2.

Next, an LED 3 is mounted on the electrode pads 2. The LED 3 is connected with the electrode pads 2 through wires 4 (S302).

Here, the LED 3 is mounted and connected with the wires 4, and then a guide unit 5 of a shape of circular ring may be additionally formed around the LED 3 on the electrode pads 2.

A first molding 6 is formed on the LED 3 using a dispensing method (S303). Silicon having a high strength and a good interfacial adhesion may be used for the first molding 6.

Next, a second molding 7 is formed on the first molding 6 (S304). Silicon having an excellent adhesion with respect to the first molding 6 may be used for the second molding 7.

The present invention exemplarily illustrates the SMD type LED package, but is not limited thereto and may be applied to an LED package where an LED is formed in a reflective hole formed in an MCPCB.

According to the LED package of the present invention, since the first and second moldings are easily formed using a dispensing method, additional processes are not necessary. Also, adherence between the first and second moldings is improved to increase the physical stability.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A light emitting apparatus comprising:
   a substrate;
   at least two distinct electrodes on the substrate, wherein the at least two distinct electrodes are spaced from each other;
   a light emitting device on one of the at least two distinct electrodes;
   optical members including a first optical member and a second optical member on the substrate, wherein the first optical member contacts and surrounds the light emitting device, wherein the second optical member is disposed on the first optical member, and wherein an outermost portion of the second optical member is spaced from the substrate; and
   a supporting unit configured to directly contact the second optical member,
   wherein the supporting unit is formed of a non-conductivity material,
   wherein the supporting unit is disposed below an upper surface of at least one of the first optical member and the second optical member,
   wherein a maximum distance between a top surface of the first optical member and a top surface of the second optical member becomes shorter in going from a center of the first optical member to opposite perimeters of the first optical member, and
   wherein the first optical member and the second optical member are formed of different materials.

2. The light emitting apparatus according to claim 1, wherein a height of the supporting unit is less than a height of at least one of the first optical member and the second optical member.

3. The light emitting apparatus according to claim 1, wherein the supporting unit is in a shape of a circular ring or a rectangular ring.

4. The light emitting apparatus according to claim 1, wherein the first optical member is formed of a material with a higher refraction index than a refraction index of the second optical member.

5. The light emitting apparatus according to claim 1, further comprising:
   at least two distinct wires, each including a contact portion for contacting the light emitting device, wherein the contact portions are encapsulated by the first optical member.

6. The light emitting apparatus according to claim 1, wherein an entire top surface of the substrate is substantially planar.

7. The light emitting apparatus according to claim 1, wherein a cross-sectional view of the light emitting apparatus includes the second optical member, the first optical member, and the light emitting device disposed on a same horizontal plane.

8. The light emitting apparatus according to claim 1, wherein each of the at least two distinct electrodes is formed by an electro-plating or etching a metal material.

9. The light emitting apparatus according to claim 1, wherein at least a portion of the first optical member directly contacts the substrate.

10. The light emitting apparatus according to claim 1, wherein the first optical member does not cover outer areas of the at least two distinct electrodes or the substrate.

11. The light emitting apparatus according to claim 1, wherein the first optical member includes an uppermost surface having a first radius of curvature greater than a second radius of curvature of an uppermost surface of the second optical member.

12. The light emitting apparatus according to claim 1, wherein a maximum distance of a contact surface between the first optical member and the substrate is formed 1.6-2.4 times larger than a maximum distance between the second optical member and the substrate.

13. The light emitting apparatus according to claim 1, wherein the first optical member includes an adhesive material for providing adhesion to the substrate or the at least two distinct electrodes.

14. The light emitting apparatus according to claim 1, wherein a lowermost portion of the second optical member has a width smaller than a middle portion of the second optical member.

15. A light emitting apparatus comprising:
a substrate;
at least two distinct electrodes on the substrate, wherein the at least two distinct electrodes are spaced from each other;
a light emitting device on the substrate;
optical members including a first optical member and a second optical member on the substrate, wherein the second optical member is disposed on the first optical member, wherein an outermost portion of the second optical member is spaced from the substrate; and
a supporting unit configured to directly contact and support the second optical member,
wherein the supporting unit is formed of a non-conductivity material,
wherein a cross-sectional view of the light emitting apparatus includes the supporting unit, the first optical member and the light emitting device on a same horizontal plane,
wherein a maximum distance between a top surface of the first optical member and a top surface of the second optical member becomes shorter in going from a center of the first optical member to opposite perimeters of the first optical member, and
wherein a diameter of the second optical member is not greater than a diameter of the first optical member at the opposite perimeters of the first optical member and the second optical member.

16. The light emitting apparatus according to claim 15, wherein an entire top surface of the substrate is substantially planar.

17. The light emitting apparatus according to claim 15, wherein the second optical member has a side surface perpendicular to a top surface of the substrate.

18. A light emitting apparatus comprising:
a substrate;
at least two distinct electrodes on the substrate, wherein the at least two distinct electrodes are spaced from each other;
a light emitting device on the substrate;
a first optical member disposed on the light emitting device, wherein the first optical member includes an upper surface having a convex shape with reference to a top surface of the substrate;
a second optical member disposed on the light emitting device and the first optical member, wherein the second optical member includes an upper surface and a lower surface; and
a supporting unit configured to support the second optical member,
wherein the lower surface of the second optical member includes a concave shape,
wherein the lower surface of the second optical member is faced with the upper surface of the first optical member,
wherein at least one portion of the second optical member has an irregular thickness,
wherein a maximum distance between a top surface of the first optical member and a top surface of the second optical member becomes shorter in going from a center of the first optical member to opposite perimeters of the first optical member, and
wherein the first optical member and the second optical member are formed of different materials.

19. The light emitting apparatus according to claim 18, wherein an entire top surface of the substrate is substantially planar.

20. The light emitting apparatus according to claim 18, wherein the second optical member has a side surface perpendicular to a top surface of the substrate.

21. The light emitting apparatus according to claim 1, wherein the first optical member and the second optical member are optically transmissive medium.

22. The light emitting apparatus according to claim 21, wherein the first optical member and the second optical member are formed of silicone of different kinds, respectively.

23. The light emitting apparatus according to claim 15, wherein the first optical member and the second optical member are optically transmissive medium.

24. The light emitting apparatus according to claim 23, wherein the first optical member and the second optical member are formed of silicone of different kinds, respectively.

25. The light emitting apparatus according to claim 18, wherein the first optical member and the second optical member are optically transmissive medium.

26. The light emitting apparatus according to claim 25, wherein the first optical member and the second optical member are formed of silicone of different kinds, respectively.

* * * * *